US006602430B1

(12) United States Patent
Nally et al.

(10) Patent No.: US 6,602,430 B1
(45) Date of Patent: Aug. 5, 2003

(54) METHODS FOR FINISHING MICROELECTRONIC DEVICE PACKAGES

(75) Inventors: Steven P. Nally, Boise, ID (US); Vernon M. Williams, Meridian, ID (US); Ford B. Grigg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 09/641,498

(22) Filed: Aug. 18, 2000

(51) Int. Cl.[7] ................................................. B24B 1/00
(52) U.S. Cl. ............................ 216/13; 216/45; 216/52; 216/53; 216/83; 134/1.3; 438/106; 438/115; 451/29; 451/41
(58) Field of Search ..................... 216/13, 14, 41, 216/45, 52, 53; 438/106, 115; 134/1.3; 451/29, 41

(56) References Cited

U.S. PATENT DOCUMENTS

| | | | | |
|---|---|---|---|---|
| 5,858,112 A | * | 1/1999 | Yonemizu et al. | 134/32 |
| 5,880,961 A | * | 3/1999 | Crump | 700/112 |
| 5,997,388 A | * | 12/1999 | Canella et al. | 451/300 |
| 6,210,992 B1 | | 4/2001 | Tandy et al. | |
| 6,245,586 B1 | * | 6/2001 | Colvin | 216/21 |
| 6,248,001 B1 | * | 6/2001 | Carson et al. | 216/21 |
| 6,336,848 B1 | * | 1/2002 | Sato | 15/77 |

FOREIGN PATENT DOCUMENTS

| | | | | |
|---|---|---|---|---|
| JP | 59-175751 A | * | 10/1984 | |
| JP | 60-74446 A | * | 4/1985 | |
| JP | 01-067346 A | * | 3/1989 | |
| JP | 06-252191 A | * | 9/1994 | |
| JP | 09-024487 A | * | 1/1997 | |

OTHER PUBLICATIONS

"Abrasive Blasting Media", McMaster–Carr, p. 2274.
Van Zant, Peter, *Microchip Fabrication, A Practical Guide to Semiconductor Processing*, 4th Edition, McGraw–Hill, United States of America, 2000, Chapter 18, pp. 557–593.

* cited by examiner

*Primary Examiner*—Anita Alanko
(74) *Attorney, Agent, or Firm*—Perkins Coie LLP

(57) ABSTRACT

Methods for finishing or refurbishing surfaces on protective covers encapsulating microelectronic dies. In one embodiment, a method for fishing a surface of a protective package on a microelectronic device includes abrading the surface of the package by engaging an abrasive media with the surface of the package, terminating the abrasion when a surface blemish has been at least partially removed from the package, and cleaning residual materials from the package after terminating the abrasion of the package surface. The abrasive media can include a fixed-abrasive member, a fixed-abrasive member and a solution, a non-abrasive member and a chemical solution having abrasive particles, or an abrasive blasting media. Methods for finishing a surface of a protective package on a microelectronic device in accordance with other embodiments of the invention include ablating the surface of the package to remove a layer of material from the package, etching the surface of the package to remove a layer of material from the package, and pressing a heated surface of stamp or press having a preselected finish against the package surface to emboss the package surface. Ablating the surface of the package to remove a layer of material from the packages, for example, can include ablating the surface of the package with a laser light.

41 Claims, 4 Drawing Sheets

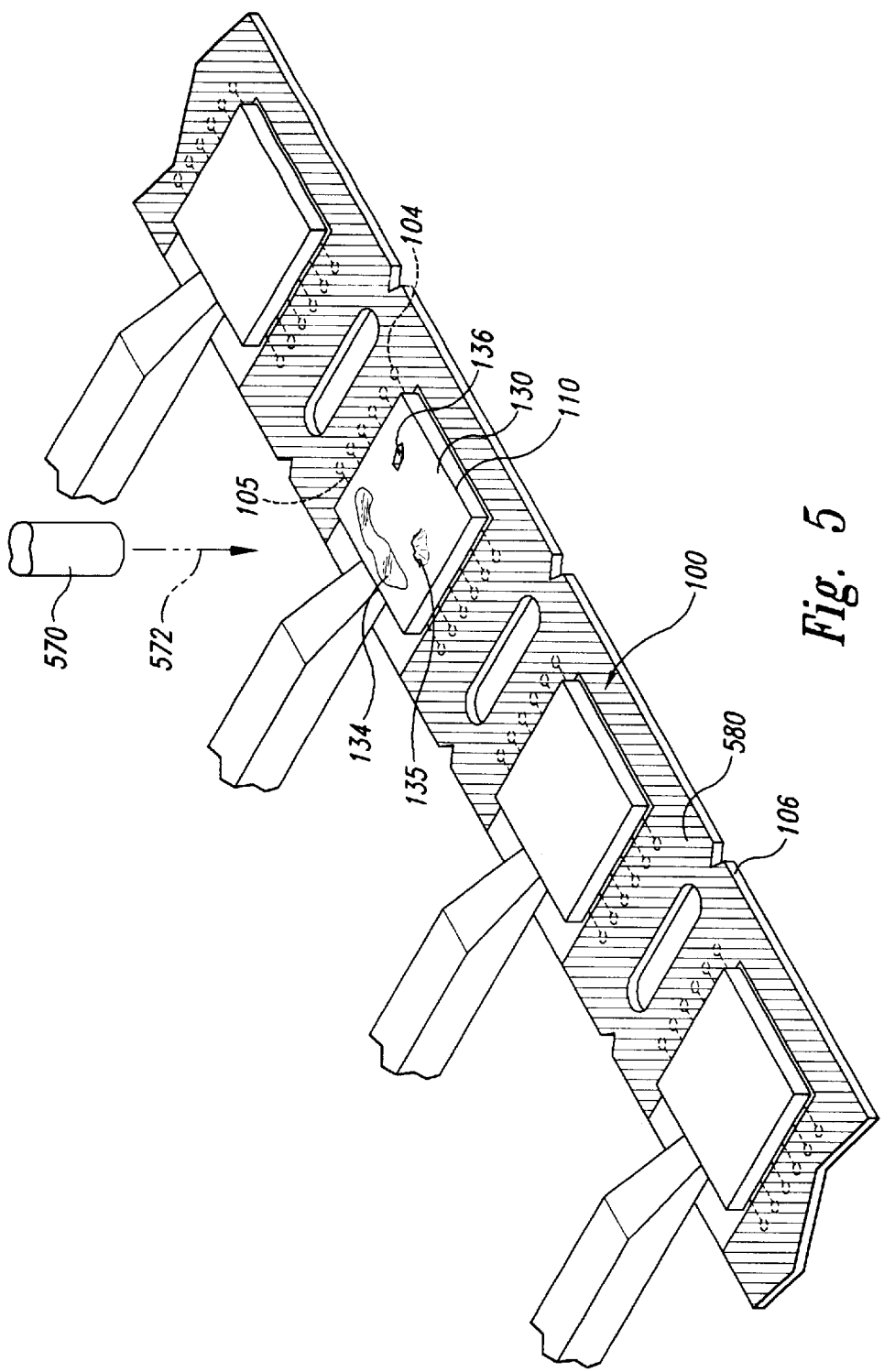

METHODS FOR FINISHING MICROELECTRONIC DEVICE PACKAGES

TECHNICAL FIELD

This invention relates to packaged microelectronic devices, and more particularly to finishing or refurbishing surfaces on protective covers encapsulating microelectronic dies.

BACKGROUND

Microelectronic devices, such as semiconductor devices, are used in products ranging from personal computers to automobiles. In most applications, microelectronic devices have a microelectronic die, a lead frame or printed circuit substrate attached to the die, and a cover or "package" encasing the die. The packages protect the die from physical damage, particulate contamination, electrical interference and abuse. The packages also provide environmental protection from chemicals, moisture, and gases that may impair the functionality of the devices. An additional function of the protective packages is to dissipate heat generated by the microelectronic devices during operation.

Microelectronic device packages are typically composed of epoxy resins or polyimide materials that offer the advantages of low weight, low material cost, and manufacturing efficiency. These "plastic" packages are produced by epoxy molding in which epoxy in a flowable state is forced into a mold to create an individual package around a microelectronic die. Multiple packages can be produced simultaneously by arranging the microelectronic devices on a plurality of lead frames, and positioning the lead frames between two mold halves having cavities around each individual die. A ram forces a flowable epoxy into each cavity to form the individual packages. After the epoxy sets in the mold, the mold halves are separated and the lead frames are placed in an oven for final curing of the molded packages. A precision cutting tool is used to separate the lead frames into individual packages after curing.

It is often desirable for microelectronic device packages to have a uniform surface finish that reflects a quality product and provides an adequate marking surface. The completed package is usually marked with key part information, such as the product type, device specifications, date, and lot number. The packages are also marked to provide fiducial reference points for optically aligning the packaged devices in subsequent processing by the device manufacturer or for handling by Printed Circuit Assembly (PCA) manufacturers. A common method of marking packages is to apply an ink with an offset printer followed by a curing step.

One problem associated with molded packages is that the surface finish may not provide an adequate marking surface. For example, resins can build up in the mold cavities after a period of use and leave asperities or stains on the molded surfaces of the package. When this happens, the molds must be cleaned and the packages may have a poor quality surface finish. As such, resin buildup in the mold cavities can reduce the throughput of molding machines and the yield of finished devices. One conventional solution to resolve resin buildup is to use a release film in the mold that seals the mold and reduces the frequency of cleaning. These films, however, can wrinkle and produce asperities or other marks on the molded surfaces of the package.

A poor surface finish on the plastic packaging can lead to many other problems. For example, stains and asperities on a package marking surface can lead to poor ink adhesion that can obscure fiducial marks and part information. It will be appreciated that poor quality fiducial marks on the surface of the package can lead to imprecise operation of the machine vision equipment used in subsequent processing and handling of the packaged devices. Moreover, if the key part information identified on the package is significantly obscured or unreadable, the packaged device may be rejected. In any case, poor quality marking cosmetically reflects poor workmanship. Accordingly, it would be desirable to develop a method of producing an adequate marking surface on a molded microelectronic device package that does not require frequent cleaning of the molds.

SUMMARY

The present invention is directed toward methods for finishing surfaces on protective packages encapsulating microelectronic dies. In one embodiment, the method includes abrading a surface of the package by engaging an abrasive media with the surface of the package, and stopping the abrasion when a surface blemish has been at least partially removed from the package. In one aspect of this embodiment, the abrasive media can be a fixed-abrasive member, and abrading the surface of the package can include pressing the surface of the package against the fixed-abrasive member and imparting motion to the package and/or the member to rub the package surface against the member. The fixed-abrasive member can also be used with a solution, and abrading the surface of the package can include rubbing the package surface against the fixed-abrasive member in the presence of the solution. In another aspect of this embodiment, the abrasive media can be a non-abrasive member and a solution having abrasive particles, and abrading the surface of the package can include rubbing the package surface against the non-abrasive member in the presence of the solution having abrasive particles. In yet another aspect of this embodiment, the abrasive media can be an abrasive blasting media, and abrading the surface of the package can include driving the abrasive media against the surface of the package.

The methods for finishing a surface of a protective package by abrasion can include controlling the depth of the abrasion by determining a depth at which the abrasion will have removed sufficient blemishes in the surface to attain a preselected surface finish, and terminating the abrasion at the depth when the preselected surface finish has been attained. The methods can also include cleaning residual materials from the package after terminating the abrasion of the package surface.

In another embodiment of the invention, the method for finishing a surface of a protective package on a microelectronic device includes chemically etching a surface of the package to remove a layer of material from the package, and cleaning residual materials and/or chemicals from the package after terminating the etching of the package surface. In one aspect of this embodiment the method can include controlling the depth of the etching by determining a depth at which the chemical etching will have sufficiently removed the blemishes from the package surface to attain a preselected surface finish, and terminating the chemical etching at the depth where the preselected surface finish has been attained.

In yet another embodiment of the invention, the method for finishing a surface of a protective package on a microelectronic device includes ablating the surface of the package to remove a layer of material from the package, and cleaning residual materials from the package after terminating the ablation of the package surface. In one aspect of this embodiment, ablating the surface can include ablating the surface of the package with laser light.

Another method for finishing the surface of a protective package on a microelectronic device in accordance with the present invention includes pressing a surface of a stamp or press against the package surface to emboss the package surface, controlling the embossing by determining the time required to produce a preselected surface finish, and terminating the embossing after the time required to produce the preselected surface finish has elapsed. In one aspect of this embodiment, the method can include heating the surface of the stamp or press while it presses against the package surface.

BRIEF DESCRIPTION OF THE DRAWINGS

FIG. 5 is an isometric view of a plurality of lead frames and a plurality of microelectronic device packages, and additional methods for finishing a package surface in accordance with alternate embodiments of the invention.

DETAILED DESCRIPTION OF THE ILLUSTRATED EMBODIMENTS

The present disclosure describes methods for finishing microelectronic device packages. The term microelectronic device package, as used herein, includes individual enclosures used to protect microelectronic dies, such as semiconductor devices with integrated circuits and other types of dies. The materials for fabricating packages include epoxy, plastic, ceramic, glass, metal and other robust materials. Many specific details of certain embodiments of the invention are set forth in the following description and in FIGS. 1–5 to provide a thorough understanding of these embodiments. One skilled in the art, however, will understand that the present invention will have additional embodiments, or that the invention may be practiced without several of the details described below.

Figure 1:
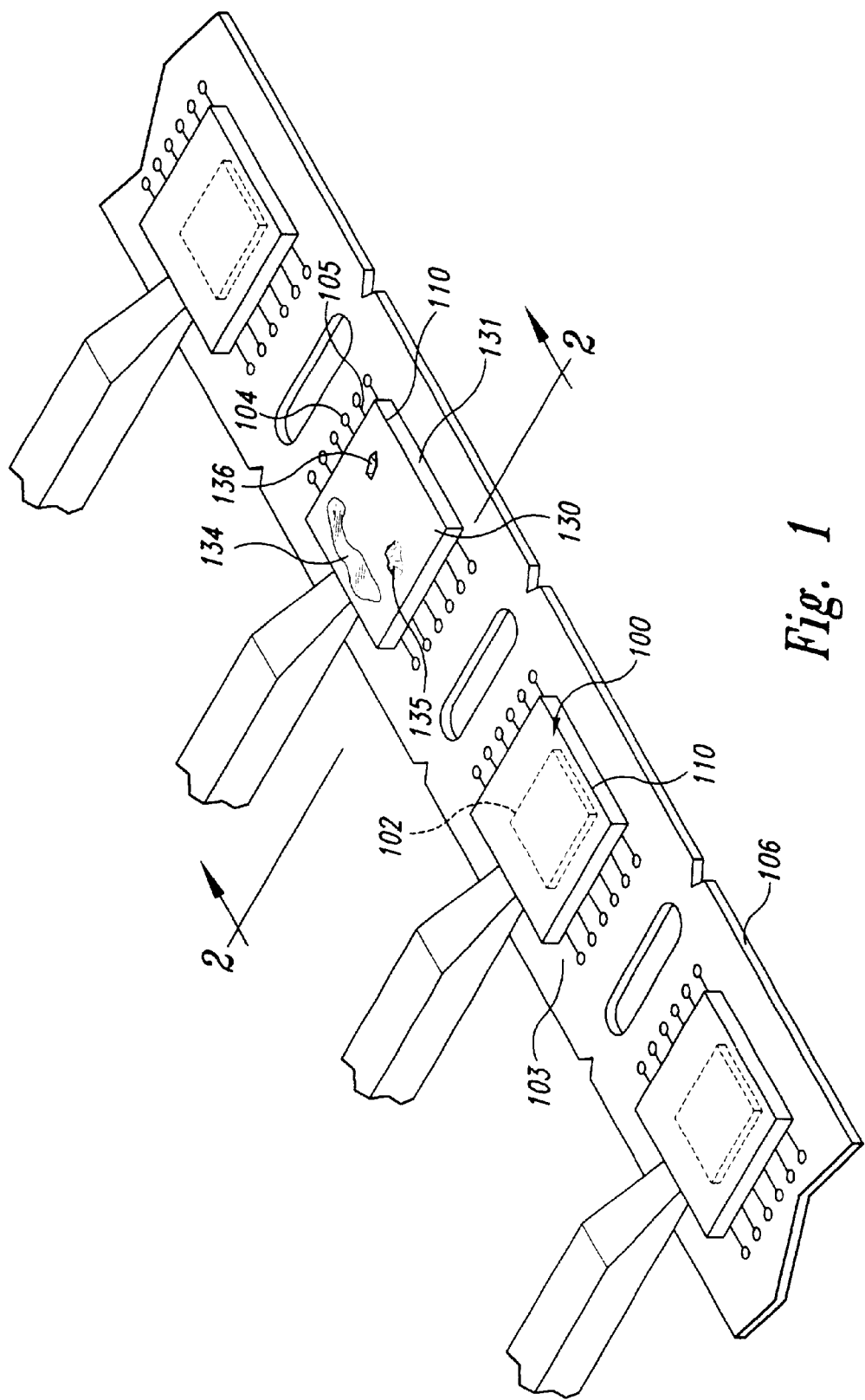
FIG. 1 is an isometric view of a plurality of microelectronic device packages with unfinished surfaces in accordance with an embodiment of the invention.

FIG. 1 is an isometric view of a plurality of packaged microelectronic devices 100 before being processed in accordance with an embodiment of the invention. The microelectronic devices 100 can each have a microelectronic die 102, a printed circuit substrate 103 or lead frame to which each die 102 is attached, and a protective casing 110 covering each die 102. The dies 102 can be memory devices or processors that include integrated circuitry in a semiconductor substrate, or the dies 102 can be other types of microelectronic components. The printed circuit substrates 103 can each have a plurality of ball-pads 104 and traces 105 extending from the ball-pads 104. The traces 105 are coupled to corresponding bond-pads (not shown) on the die 102. The printed circuit substrates 103 shown in FIG. 1 are initially part of an interposing substrate assembly 106, which may remain intact during the abrasion processes discussed below (as is evident in FIGS. 3–5). During Back-End-of-Line (BEOL) processing, the interposing substrate assembly 106 is cut to separate individual packaged devices 100 from one another.

The protective casing 110 covering each die 102 can be all or part of a "device package" for encapsulating the die 102 and any other delicate components, such as wire-bond lines or bond-pads. The device package 110 can be formed by injecting a thermosetting material or other mold compound into a mold and then curing the package. The device package 110 next to the cross-section indication line 2—2 has a top portion 130 with a surface blemish, such as a stain 134, a raised asperity 135, and/or a recessed asperity 136. In one aspect of this embodiment, the top portion 130 is a top marking surface of the microelectronic device 100. In other embodiments, a side surface 131 and/or other surfaces of the device package 110 can be marking surfaces. The top portion 130 shown in FIG. 1 is unsuitable for marking because the stain 134 and/or the surface asperities 135 and 136 may cause poor ink adhesion and/or obfuscate the ink marks.

Figure 2A:
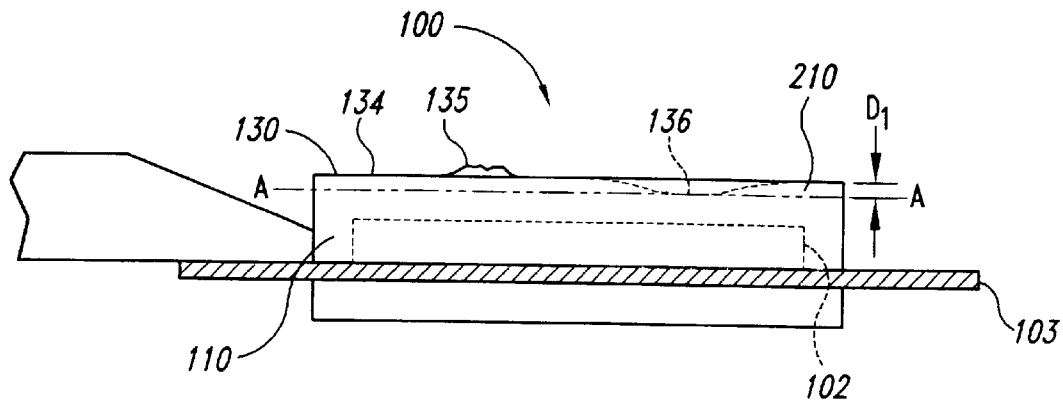
FIG. 2A is an enlarged cross-sectional view of a microelectronic device taken substantially along line 2—2 of FIG. 1 before finishing a surface of the device in accordance with one embodiment of the invention.

FIG. 2A is an enlarged cross-sectional view of the microelectronic device 100 showing the top portion 130 having the stain 134 and the asperities 135 and 136. One aspect of the invention is removing a molded surface layer 210 to a depth $D_1$, defined by plane A—A, to achieve a finished surface suitable for marking and devoid of the stain 134 and the asperities 135 and 136. The depth $D_1$ of the molded surface layer 210 can generally be approximately 0.001 to 0.01 inch, but the depth $D_1$ can be outside of this range depending on the depth of the deepest asperity and/or the thickness of the device package 110 or the die 120.

The molded surface layer 210 can be removed from the package 110 by abrading the top portion 130 of the package 110 with an abrasive media. In other embodiments, the molded surface layer 210 can be removed by etching or ablating the top portion 130. And, in yet other embodiments, the top portion 130 can be embossed to eliminate or camouflage the stain 134 and the asperities 135 and 136. In addition, as will be apparent to one of skill in the ordinary art, combinations of these methods can also be used.

Figure 2B:
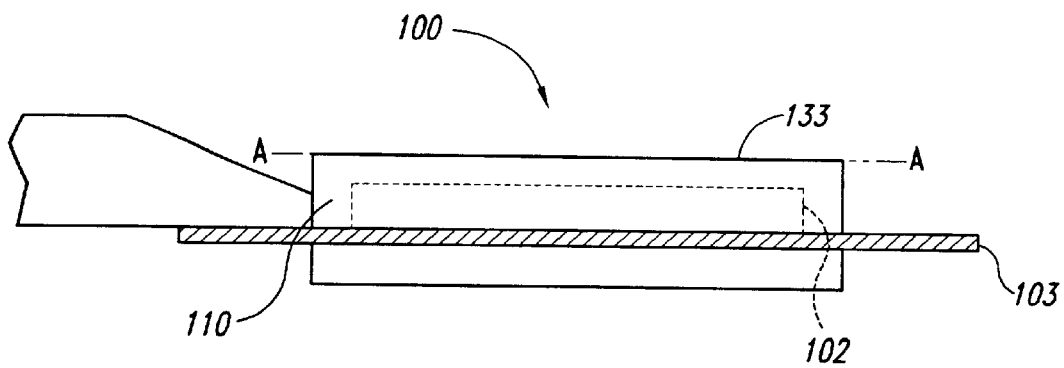
FIG. 2B is an enlarged cross-sectional view of a microelectronic device taken substantially along line 2—2 of FIG. 1 after finishing a surface of the device in accordance with one embodiment of the invention.

FIG. 2B is an enlarged cross-sectional view of the microelectronic device 100 after the molded surface layer 210 (FIG. 2A) has been removed from the top portion 130 of the package 110 in accordance with an embodiment of the invention. The package 110 now has a surface 133 with a uniform texture and color suitable for marking because the stain 134 and the surface asperities 135 and 136 have been removed.

Figure 3:
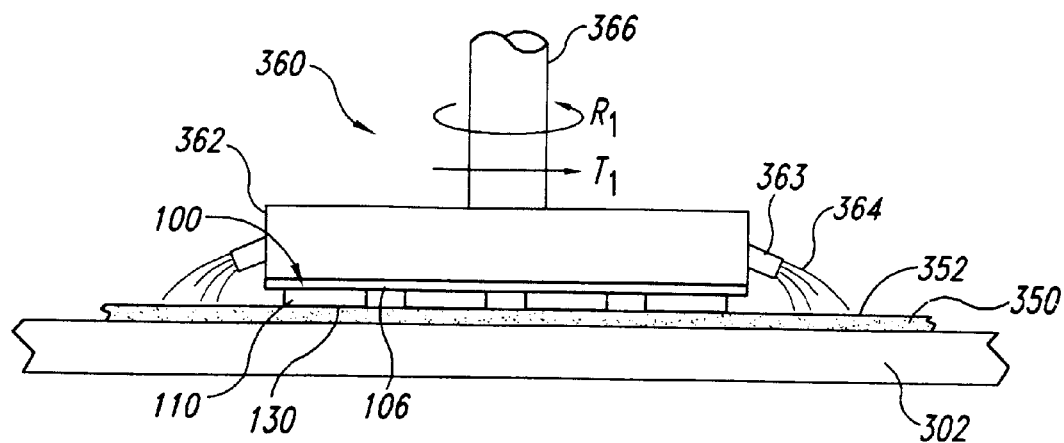
FIG. 3 is a side elevational view of a method for finishing the package surfaces of a plurality of microelectronic devices in accordance with one embodiment of the invention.

FIG. 3 is a side elevational view of the microelectronic devices 100 illustrating a method for removing the molded surface layer 210 (FIG. 2A) from the packages 110 with an abrasive media in accordance with one embodiment of the invention. The abrasive media in this embodiment is a stationary fixed-abrasive member 350 having an abrasive surface 352. A support table 302 supports the fixed-abrasive member 350. In one aspect of this embodiment, the fixed-abrasive member 350 can be a wet/dry media having a grit of approximately 120–1200. In other embodiments, the fixed-abrasive member 350 can be other fixed-abrasive media and/or have other abrasivity.

A carrier assembly 360 controls and protects the packages 110 and the interposing substrate assembly 106 while the molded surface layer 210 (FIG. 2A) is being removed. The carrier assembly 360 generally has a head 362 to pickup, hold, and release the interposing substrate assembly 106 in an inverted position at appropriate stages of the surface finishing process. In one aspect of this embodiment, several nozzles 363 can be attached to the head 362 to dispense water or a chemical solution 364 onto the abrasive surface 352 of the fixed-abrasive member 350. It other embodiments, the solution 364 can be omitted for a dry abrasive process.

In fixed-abrasive applications, the solution 364 is typically a "clean solution" without abrasive particles because the abrasive particles are fixedly distributed across the abrasive surface 352 of the fixed-abrasive member 350. In other applications, the fixed-abrasive member 350 can be replaced by a non-abrasive member without abrasive particles that is composed of a polymeric material (e.g., polyurethane), a resin, or other suitable materials. The solutions 364 used with non-abrasive members are typically slurries with abrasive particles and chemicals that can remove material from a microelectronic device package. The abrasive particles used in such abrasive solution 364 can be ceria, silica or other types of particles that are commonly known.

To remove the molded surface layer 210 (FIG. 2A) from the packages 110, the carrier assembly 360 presses the top portions 130 of the inverted packages 110 against the abrasive surface 352 of the fixed-abrasive member 350 in the presence of the solution 364. An actuator shaft 366 then rotates the head 362 in a direction $R_1$ and/or translates the head 362 in a direction $T_1$. As a result, the fixed-abrasive particles on the abrasive surface 352 and/or the chemicals in the solution 364 remove material from the top portions 130 of the packages 110. In one aspect of this embodiment, the surface finishing process is controlled by only removing the minimum depth of material $D_1$ required to remove the deepest asperity 136 (FIG. 2A) from the top portions 130.

After removing the molded surface layer 210, residual materials from the surface finishing process can be cleaned from at least a portion of the microelectronic devices 100. In one cleaning application, a wet-cleaning process can include washing the finished surfaces 133 (FIG. 2B) with water and/or other suitable chemicals. Other cleaning applications can be dry cleaning processes that use a suitable wiping material, a magnetic cleaning process, or a pressurized gas to remove residual particles from the packaged devices 100. In addition, other processes or combinations of these processes can be used to clean the microelectronic devices 100 after removing the molded layer 210 or otherwise finishing the surface of the device package 110.

Figure 4:
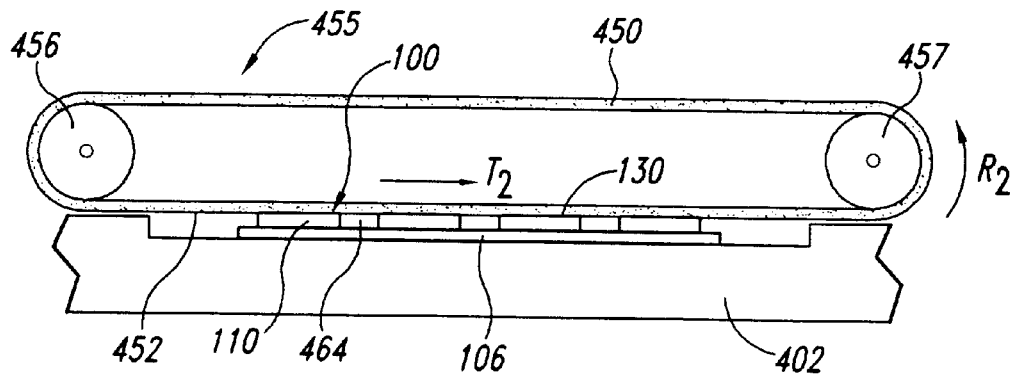
FIG. 4 is a side elevational view of a method for finishing the package surfaces of a plurality of microelectronic devices in accordance with another embodiment of the invention.

FIG. 4 is a side elevational view of the microelectronic devices 100 illustrating another method for removing the molded surface layer 210 (FIG. 2A) from the packages 110 with an abrasive media in accordance with another embodiment of the invention. The abrasive media in this embodiment is a fixed-abrasive belt 450 having an abrasive surface 452 that moves in relation to the stationary package 110. The fixed-abrasive belt 450 is driven by one or more rollers 456 and 457 of a roller assembly 455. A support table 402 fixedly supports the interposing substrate assembly 106 during the surfacing process. In one aspect of this embodiment, the fixed-abrasive belt 450 can be a wet/dry media having a grit of 200–1200. In other embodiments, the fixed-abrasive belt 450 can be other fixed-abrasive media and/or have other abrasivities.

To remove the molded surface layer 210 (FIG. 2A) from the packages 110, the roller assembly 455 presses the abrasive surface 452 against the top portions 130 of the packages 110 while the rollers 457 and 456 are rotating in a direction $R_2$. As a result, the abrasive surface 452 translates across the top portions 130 in a direction $T_2$ and the abrasive particles remove material from the packages 110. In one aspect of this embodiment, the surface finishing process is controlled by only removing the minimum depth of material $D_1$ required to remove the deepest asperity 136 (FIG. 2A) from the top portions 130.

The fixed-abrasive belt 450 of the surface finishing method illustrated in FIG. 4 can be used in conjunction with a solution to remove the molded surface layer 210 (FIG. 2A) from the packages 110. In one aspect of this embodiment, the solution 464 is a "clean solution" without abrasive particles because the abrasive particles are fixedly distributed across the abrasive surface 452 of the fixed-abrasive belt pad 450. In other applications, the belt 450 can be a non-abrasive belt without abrasive particles and the solution 464 can be a slurry with abrasive particles.

FIG. 5 is an isometric view of the microelectronic devices 100 and the interposing substrate assembly 106 illustrating other methods for removing the molded surface layer 210 (FIG. 2A) from the packages 110 in accordance with yet additional embodiments of the invention. In one such embodiment, a nozzle 570 sprays a pressurized flow of abrasive particles 572 against the top portions 130 of selected packages 110 that have unacceptable surfaces. The abrasive particles 572 abrade the surface of the device package to remove the surface layer 210. In one aspect of this embodiment, the surface finishing process is controlled by determining a time required to remove the minimum depth of material $D_1$ that includes the deepest asperity 136 (FIG. 2A), and stopping the pressurized flow of abrasive particles 572 at that time. The abrasive particles 572 can be a walnut media, polymeric materials, aluminum oxide $Al_2O_3$, or other suitable materials that can remove the molded surface layer 210 (FIG. 2A) to provide a surface of uniform texture and color suitable for marking.

The exposed portions of the interposing substrates 103 can be covered with a mask 580 to protect the traces 105, ball-pads 104 and other features apart from the packages 110 subject to the flow of abrasive particles 572. The mask 580 can be a metal template having holes for the device packages 110, or the mask 580 can be a thin film disposed on the interposing substrate assembly 106. For example, the mask 580 can be a removable plastic film having holes for the device packages 110 similar to plastic decals that oil service companies affix to windows on vehicles.

In yet another embodiment of the invention illustrated in FIG. 5, the device 110 can be ablated to produce a surface with uniform texture and a color suitable for marking. The device package 110, for example, can be ablated with a laser or another heat source. One expected advantage of using a laser source 570 to ablate material from the packages 110 is that the laser light 572 can be focused on a discrete surface area in a manner that reduces contamination and/or damage to the traces 105, the ball-pads 104, or other sensitive components.

In addition to using the methods of abrasion and ablation to finish the top portions 130 of the packages 110, the packages 110 can be immersed in a suitable chemical bath that etches the molded surface layer 210 (FIG. 2A). In one aspect of this embodiment, the molded surface layer 210 can be removed by a chemical bath containing hydrofluoric acid followed by a rinse with deionized water. In other embodiments, other chemicals and rinses that remove the molded layer 210 can be used. The exposed portions of the interposing substrates 103 can be covered with a suitable mask to protect the traces 105, ball-pads 104 and other features apart from the packages 110 subject to the chemical bath.

The top portions 130 of the microelectronic devices 100 can also be finished using embossing methods that form a texture and color on the packages 110 without removing material from the top portions 130. In one aspect of this embodiment, a stamp or press having an embossing surface with a preselected finish can be used in conjunction with heat and/or pressure to produce the desired texture and/or color on the top portions 130. The texture of the embossed surface may eliminate some surface asperities by plastic deformation of the device package 100. The embossed surface may also reduce the visibility of stains because the surface texture may reduce the distinctiveness of many stains.

An advantage of using one of the methods of the present invention (e.g., abrasion, ablation, chemical etching or embossing) to finish the microelectronic devices 100 after package molding is that the period between mold cleaning can be extended. By taking the finishing process outside of the molding process, the molding process does not have to be stopped for mold cleaning every time the molds begin to produce unsatisfactory surfaces. As such, several embodiments of the invention are expected to enhance the throughput and utilization of molding equipment.

Another advantage of using one of the methods of the present invention to finish the top portions 130 of the packages 110 is that they are expected to consistently provide good surfaces for producing clear and distinct marks on the package. As such, the packages can consistently have distinct fiducial marks to enhance optical recognition by machine vision equipment in subsequent handling of the microelectronic device 100. Additionally, packages that have been marked with incorrect or unreadable part information can be refinished and re-marked rather than discarded. Thus, several embodiments of the invention are expected to enhance the yield of finished microelectronic devices 100 for use in equipment that relies on machine vision technology.

From the foregoing it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method for simultaneously finishing a surface of a protective package on each of a plurality of microelectronic devices carried on a common substrate, comprising:
   simultaneously abrading at least a portion of the surface of each package by engaging an abrasive media with the surface of each package;
   stopping the abrasion when a surface blemish has been at least partially removed from at least one of the packages; and
   after stopping the abrasion, cutting the common substrate to separate the microelectronic devices from one another.

2. The method of claim 1 wherein the abrasive media is a fixed-abrasive member and abrading the surface of each package comprises pressing the surface of each package against the fixed-abrasive member and imparting motion to the common substrate and/or the member to rub each package's surface against the member.

3. The method of claim 2 wherein the fixed-abrasive member is a fixed-abrasive pad having a wet/dry media with a grit of 120–1200.

4. The method of claim 1 wherein the abrasive media is a fixed-abrasive member and a solution, and abrading the surface of each package comprises pressing the surface of each package against the fixed-abrasive member in the presence of the solution and imparting motion to the common substrate and/or the fixed-abrasive member to rub each package's surface against the fixed-abrasive member in the presence of the solution.

5. The method of claim 4 wherein the fixed-abrasive member is a fixed-abrasive pad having a grit of 120–1200, and the solution is a clean solution comprising water.

6. The method of claim 1 wherein the abrasive media is a non-abrasive member and a chemical solution having abrasive particles, and abrading the surface of each package comprises pressing the surface of each package against the non-abrasive member in the presence of the solution and imparting motion to the common substrate and/or the non-abrasive member to rub each package's surface against the member in the presence of the solution.

7. The method of claim 6 wherein the non-abrasive member is a non-abrasive pad comprising polyurethane, and the abrasive particles in the chemical solution are comprised of one or more of ceria, alumina, silica.

8. The method of claim 1 wherein the abrasive media is an abrasive blasting media and abrading the surface of each package comprises driving the abrasive blasting media against the surface of each package.

9. The method of claim 8 wherein the abrasive blasting media is comprised of one or more of a walnut media, a polymeric media, or an aluminum oxide media.

10. The method of claim 1 wherein stopping the abrasion when a surface blemish has been at least partially removed includes stopping the abrasion when a depth of 0.001–0.010 inch of material has been removed from at least a portion of one of the packages.

11. The method of claim 1, further comprising cleaning residual materials from the packages after stopping the abrasion of each package's surface.

12. The method of claim 1 wherein the common substrate comprises an interposing substrate assembly, and wherein the method further comprises positioning a masking member at least adjacent to a portion of the interposing substrate assembly such that the portion of each package's surface to be abraded is not covered by the masking member.

13. A method for simultaneously finishing a molded surface of a protective resin package on each of a plurality of microelectronic devices carried on a common substrate, comprising:
   simultaneously abrading at least a portion of the molded resin surface of each of the packages by pressing the surface of each package against an abrasive media and imparting motion to the common substrate and/or the abrasive media to rub the package surfaces against the abrasive media and remove a portion of the package;
   cutting the common substrate to separate the microelectronic devices from one another after terminating the abrasion of the molded resin surface; and
   cleaning residual materials from at least a portion of the packages after terminating the abrasion of the molded resin surface.

14. The method of claim 13, further comprising:
controlling the depth of the abrasion by determining a depth at which the abrasion will have removed sufficient blemishes in the surface of at least one of the packages to attain a preselected surface finish and terminating the abrasion at the depth where the preselected surface finish has been attained.

15. The method of claim 13 wherein the molded surface of each package to be finished is a primary marking surface of the package, and abrading the molded surface comprises engaging the primary marking surface with the abrasive media.

16. The method of claim 13 wherein cleaning residual materials further comprises cleaning at least a portion of the packages with de-ionized water and a polyvinyl chloride brush.

17. The method of claim 13 wherein the abrasive media is a fixed-abrasive member, and abrading the molded surface of each package comprises engaging the molded surface with the fixed-abrasive member.

18. The method of claim 13 wherein the abrasive media is a fixed-abrasive member and a solution, and abrading the surface of each package comprises pressing the surface of each package against the fixed-abrasive member in the presence of the solution and imparting motion to the common substrate and/or the fixed-abrasive member to rub each package's surface against the fixed-abrasive member in the presence of the solution.

19. The method of claim 13 wherein the abrasive media is a non-abrasive member and a chemical solution having abrasive particles, and abrading the surface of each package comprises pressing the surface of each package against the non-abrasive member in the presences of the solution and imparting motion to the common substrate and/or the non-abrasive member to rub each package's surface against the non-abrasive member in the presence of the solution.

20. The method of claim 13 wherein the abrasive media is an abrasive blasting media and abrading the molded surface of each package comprises engaging the molded surface of each package with the abrasive blasting media.

21. The method of claim 13 wherein the common substrate comprises an interposing substrate assembly, and wherein the method further comprises positioning a masking member at least adjacent to a portion of the interposing substrate assembly such that the portion of each package's surface to be abraded is not covered by the masking member.

22. A method for packaging a microelectronic device, the package having a uniformly textured and colored surface, comprising:
molding package compound at least partially around a microelectronic die in a mold to at least partially encase the microelectronic die, leaving a surface blemish on a marking surface of the mold compound;
removing the package compound from the mold;
prior to marking the marking surface, abrading at least a portion of the marking surface by engaging an abrasive media with the marking surface;
terminating the abrasion when the surface blemish has been at least partially removed from the package; and
marking the abraded marking surface after terminating the abrasion.

23. The method of claim 22 wherein the abrasive media comprises a fixed-abrasive member and abrading the surface of the package comprises pressing the surface of the package against the fixed-abrasive member and imparting motion to the package and/or the member to rub the package surface against the member.

24. The method of claim 22 wherein the abrasive media is a non-abrasive member and a chemical solution having abrasive particles, and abrading the surface of the package comprises pressing the surface of the package against the non-abrasive member in the presence of the solution and imparting motion to the package and/or the non-abrasive member to rub the package surface against the member in the presence of the solution.

25. The method of claim 22 wherein the abrasive media is an abrasive blasting media and abrading the surface of the package comprises driving the abrasive blasting media against the surface of the package.

26. The method of claim 22, wherein the package is positioned adjacent to an interposing substrate assembly, and wherein the method further comprises positioning a masking member at least adjacent to a portion of the interposing substrate assembly such that the portion of the package surface to be abraded is not covered by the masking member.

27. A method for forming protective packaging on microelectronic devices, comprising:
molding a protective resin package at least partially around each of a plurality of microelectronic dies in a mold to at least partially encase each microelectronic die, leaving a surface blemish on a primary marking surface of at least one of the packages;
removing the packages from the mold;
identifying the at least one package having the surface blemish on its primary marking surface; and
altering at least a portion of the surface blemish by changing the primary marking surface.

28. The method of claim 27 wherein altering the surface blemish comprises abrading at least a portion of the primary marking surface by engaging an abrasive media with the primary marking surface.

29. The method of claim 28 wherein the abrasive media is a fixed-abrasive member and abrading the primary marking surface comprises pressing the surface against the fixed-abrasive member and imparting motion to the package and/or the member to rub the marking surface against the member.

30. The method of claim 28 wherein the abrasive media is a fixed-abrasive member and a solution, and abrading the primary marking surface comprises pressing the surface of the package against the fixed-abrasive member in the presence of the solution and imparting motion to the package and/or the fixed-abrasive member to rub the primary marking surface against the fixed-abrasive member in the presence of the solution.

31. The method of claim 28 wherein the abrasive media is a non-abrasive member and a solution having abrasive particles, and abrading the primary marking surface of the package comprises pressing the surface against the non-abrasive member in the presence of the solution and imparting motion to the package and/or the non-abrasive member to rub the primary marking surface against the member in the presence of the solution.

32. The method of claim 28 wherein the abrasive media is an abrasive blasting media and abrading the primary marking surface comprises driving the abrasive blasting media against the surface.

33. The method of claim 28 wherein the primary marking surface of the package is positioned adjacent to an interposing substrate assembly, and wherein the method further comprises positioning a masking member adjacent to at least a portion of the interposing substrate assembly such that the portion of the primary marking surface to be abraded is not covered by the masking member.

34. The method of claim 27 wherein altering the surface blemish includes etching at least a portion of the primary marking surface to remove at least a portion of the blemish.

35. The method of claim 27 wherein altering the surface blemish includes ablating at least a portion of the primary marking surface to remove at least a portion of the blemish.

36. The method of claim 27 wherein altering the surface blemish includes pressing a surface of a stamp or press having a preselected finish against at least a portion of the primary marking surface to emboss the primary marking surface.

37. A method for packaging a microelectronic die carried on a substrate, comprising:

молding package compound at least partially around a microelectronic die in a mold to at least partially encase the microelectronic die, leaving a portion of the substrate exposed and leaving a surface blemish on a marking surface of the package compound;

removing the resulting package from the mold;

prior to marking the marking surface, positioning a masking member at least adjacent to a portion of the substrate such that the marking surface is not covered by the masking member;

prior to marking the marking surface, abrading at least a portion of the marking surface by engaging an abrasive media with the marking surface;

terminating the abrasion when the surface blemish has been at least partially removed from the package; and marking the abraded marking surface after terminating the abrasion.

38. The method of claim 37 wherein the abrasive media comprises a fixed-abrasive member and abrading the surface of the package comprises pressing the surface of the package against the fixed-abrasive member and imparting motion to the package and/or the member to rub the package surface against the member.

39. The method of claim 37 wherein the abrasive media is a non-abrasive member and a chemical solution having abrasive particles, and abrading the surface of the package comprises pressing the surface of the package against the non-abrasive member in the presence of the solution and imparting motion to the package and/or the non-abrasive member to rub the package surface against the member in the presence of the solution.

40. The method of claim 37 wherein the abrasive media is an abrasive blasting media and abrading the surface of the package comprises driving the abrasive blasting media against the surface of the package.

41. The method of claim 37, wherein the package is positioned adjacent to an interposing substrate assembly, and wherein the method further comprises positioning a masking member at least adjacent to a portion of the interposing substrate assembly such that the portion of the package surface to be abraded is not covered by the masking member.

* * * * *

UNITED STATES PATENT AND TRADEMARK OFFICE
CERTIFICATE OF CORRECTION

PATENT NO.    : 6,602,430 B1                                    Page 1 of 1
DATED         : August 5, 2003
INVENTOR(S)   : Steven P. Nally et al.

It is certified that error appears in the above-identified patent and that said Letters Patent is hereby corrected as shown below:

Title page,
Item [57], ABSTRACT,
Line 3, "fishing" should be -- finishing --;

Column 2,
Line 29, "fixed-abrasive abrasive member" should be -- fixed-abrasive member --;
Line 57, insert comma between "embodiment" and "the";

Column 5,
Line 13, "It" should be -- In --;

Column 7,
Line 6, insert -- surface -- between "molded" and "layer";

Column 8,
Line 31, insert -- or -- between "alumina," and "silica.";

Column 9,
Line 33, "presences" should be -- presence --;
Line 54, "removing the package compound from the mold" should be -- removing the package from the mold --;

Signed and Sealed this

Second Day of December, 2003

JAMES E. ROGAN
*Director of the United States Patent and Trademark Office*